(12) United States Patent
Anderson et al.

(10) Patent No.: US 12,726,749 B2
(45) Date of Patent: Sep. 1, 2026

(54) MICROPHONE HEAD CONNECTOR ADAPTER

(71) Applicant: Sound Devices LLC, Reedsburg, WI (US)

(72) Inventors: Matthew G. Anderson, Madison, WI (US); Jason McDonald, Madison, WI (US)

(73) Assignee: Sound Devices, LLC, Reedsburg, WI (US)

( * ) Notice: Subject to any disclaimer, the term of this patent is extended or adjusted under 35 U.S.C. 154(b) by 140 days.

(21) Appl. No.: 18/755,831

(22) Filed: Jun. 27, 2024

(65) Prior Publication Data

US 2025/0008250 A1 Jan. 2, 2025

Related U.S. Application Data

(60) Provisional application No. 63/510,522, filed on Jun. 27, 2023.

(51) Int. Cl.

| | |
|---|---|
| ***H04R 1/08*** | (2006.01) |
| ***H01Q 1/22*** | (2006.01) |
| ***H03F 3/24*** | (2006.01) |
| ***H04R 1/04*** | (2006.01) |
| ***H04R 3/00*** | (2006.01) |

(52) U.S. Cl.

CPC ............... *H04R 1/083* (2013.01); *H01Q 1/22* (2013.01); *H03F 3/245* (2013.01); *H04R 1/04* (2013.01); *H04R 3/00* (2013.01); *H03F 2200/03* (2013.01); *H03F 2200/451* (2013.01); *H04R 2420/07* (2013.01); *H04R 2430/01* (2013.01)

(58) Field of Classification Search

CPC . H04R 1/02; H04R 1/04; H04R 1/083; H04R 1/08; H04R 2420/07

See application file for complete search history.

(56) References Cited

U.S. PATENT DOCUMENTS

| | | | | |
|---|---|---|---|---|
| 8,571,238 | B2 | 10/2013 | Plath | |
| 9,866,972 | B2 * | 1/2018 | Veneri | H04R 23/00 |
| 10,149,037 | B1 * | 12/2018 | Chen | H04R 1/105 |
| 11,683,625 | B2 * | 6/2023 | Kaiser | H05B 47/12 381/355 |
| 2010/0054515 | A1 * | 3/2010 | Donauer | H04R 1/08 381/355 |

(Continued)

FOREIGN PATENT DOCUMENTS

| | | | |
|---|---|---|---|
| CN | 210274427 | U | 4/2020 |
| CN | 111988687 | A | 11/2020 |

OTHER PUBLICATIONS

"HHA—Handheld Microphone Adapter", https://ambient.de/en/products/hha-mikrofonadapter?variant=4559932289699, accessed Feb. 12, 2025.

(Continued)

*Primary Examiner* — Disler Paul

(74) *Attorney, Agent, or Firm* — Andrus Intellectual Property Law, LLP

(57) ABSTRACT

A handheld wireless microphone body may be connected to an assortment of microphone heads, providing compatibility between models from differing manufactures including accommodating differing attachment threads and electrical/audio output contact configurations without the need for hardware or software substitution.

16 Claims, 9 Drawing Sheets

Detailed view of head connection adapter – including ring, PCB and seal

(56) References Cited

U.S. PATENT DOCUMENTS

2018/0295436 A1* 10/2018 Fontana ................. H04R 1/028
2022/0018489 A1 1/2022 Downs
2023/0039570 A1* 2/2023 Yang ........................ H04R 1/04
2023/0156385 A1 5/2023 Schillebeeckx et al.
2023/0156387 A1* 5/2023 Su ............................ H04R 7/18
381/334

OTHER PUBLICATIONS

"HHA compatibility chart", https://faq. ambient. de/hc/en-001/articles/5280364095250-HHA-compatibility chart, accessed Feb. 12, 2025.
"Ambient—Handheld Adaptor", 2022, https://web.archive.org/web/20220521184209/https://ambient.de/en.
PCT/U2024/035702, International Search Report and Written Opinion dated Oct. 16, 2024, 17 pages.
Shure User Guide for AD651B Talk Switch, Version 6, (2019-J), 11 pages.
PCT/U2024/035702, International Preliminary Report on Patentability dated Jan. 8, 2026, 11 pages.

* cited by examiner

Detailed view of head connection adapter – including ring, PCB and seal

Detailed view of PCB
for head connection adapter

| Pin | Pin name | Description | Mic Type A | Mic Type B | Mic Type C |
|---|---|---|---|---|---|
| P1 | Audio / Ground | Either used as audio or ground, depending on mic head sensed | Audio | Ground | Ground |
| P2 | Audio | Audio Signal used for all 3 mic types | Audio | Audio | Audio |
| P3 | Supply voltage | Supply voltage for all 3 mic types | 5V | 10V | 3 |
| P3A | Head detect | Pin to detect when mic head has been screwed on if it connects to P3 | head detect | head detect | head detect |
| P4 | ID / I2C | Used for either ID or digital comm (I2C) depending on mic type | 5V | ID | 12C |
| P5 | ID / I2C | Used for either ID or digital comm (I2C) depending on mic type | Ground | ID | 12C |
| P6 | Ground / no-connect | Either ground or no-connect, depending on mic type | Ground | no connect | no connect |

FIG. 2C

Flipping adapter for different head format

Attaching collar ring 201 to microphone body 300

Electrical contact configuration for "Type A" head

Electrical contact configuration for "Type B" head

MICROPHONE HEAD CONNECTOR ADAPTER

CROSS-REFERENCE TO RELATED APPLICATION

The present application claims priority of U.S. Provisional Patent Application No. 63/510,522, filed Jun. 27, 2023, the content of which is incorporated herein by reference in its entirety.

FIELD OF THE INVENTION

The disclosed invention provides means to improve the flexibility and usability of a handheld wireless microphone body with different microphone heads. This invention allows users to switch microphone heads on the body of the wireless microphone without requiring any modifications to hardware, software or electronics.

BACKGROUND OF THE INVENTION

Due to the high degree of convenience and freedom of movement, the use of handheld wireless microphones has seen a dramatic increase in use over the last several years with many new products being successfully marketed. Aside from the convenience of eliminating any concerns regarding a corded connection, not all wireless microphones are created equal. While many manufacturers strive for recognition as offering the most pristine sound quality, various makes of microphone heads nonetheless provide subtle perceptible differences in directional gain pattern and/or frequency sensitivity. Aside from those attributable to the microphone head, additional differences may exist between different makes with regard to the electronics contained in the microphone body and the wireless transmitter. For example, these differences may include varying weight, bandwidth, wireless range, battery life and ornamental qualities. Some highly desirable (high performance) models of microphone heads are manufactured by Shure and Sennheiser Corp. However, these brands typically require differing thread patterns for mounting the microphone head to the microphone body along with differences in the electrical connector arrangement between the microphone head and body. Ambient Recording GmbH, Munich, DE, produces a variety of connector adapters designed to connect various microphone bodies with a head configured like a Shure head and other connector adapters designed to connect various microphone bodies with a head configured like a Sennheiser head, with other connector adapters being made for heads made by different manufactures with different threads and/or electrical connector arrangement. Unfortunately, the microphone head adapters known in the prior art are generally designed to be compatible with only one specific model or configuration of microphone head. For example, if a performer wants to switch between types of microphone head, if an adapter is needed, they most likely need to also install a different head adapter on the microphone body to provide compatible threads and electrical connector patterns for the new microphone head.

There have been instances where famous performers have invested significant sums of money to externally decorate microphone sleeves to their liking for performances, e.g. the addition of custom handles, artwork, precious gems or other decorative or functional features. Accordingly, especially in these cases, the performer may wish to use the same microphone body/sleeve assembly but switch between multiple microphone heads without any concerns involving the need for disassembly and assembly or for variations due to the electronics in the microphone body.

The present invention provides the user (or performer) greater flexibility in selecting from a variety of microphone heads without needing to be concerned about mechanical and electrical compatibility with the head adapter or body.

SUMMARY OF THE INVENTION

The invention is a handheld wireless microphone apparatus with a removable microphone head connection adapter that enables the mechanical and electrical attachment of a first type of microphone head and, if reversed, the mechanical and electrical attachment of a second type of microphone head. In preferred embodiments, the microphone body can electrically accommodate a third type of microphone head, or additional types, as well.

The wireless handheld microphone apparatus has a main body that is suitable to be gripped by the performer and an RF antenna located at the bottom of the main body. In accordance with the invention, an array of plug connectors, e.g. spring-loaded pin connectors, are attached to the top end of the main sleeve. The plug connectors are arranged to receive electrical audio signals from at least the first type of microphone head and alternatively from the second type of microphone head. The first type of microphone head has audio output conductors, e.g. annular conductor rings, in a first physical configuration, while the audio output conductors in the second type of microphone head are in a different physical configuration. Processing means located within the main body, e.g. a field programable gate array, receives the electrical audio signals from the plug connectors and provides audio transmission signals to the RF antenna for wireless RF transmission. The microphone body preferably also includes a battery and power conversion and charging circuitry as is known in the art.

A connection adapter attaches the selected microphone head to the body. The connection adapter has a reversible collar that includes means for mechanically attaching the collar to the first type of microphone head (e.g., threads configured to fit threads on the first type of microphone head on a first side of the collar) and alternatively means for mechanically attaching the collar to the said second type of microphone head (e.g., threads configured to fit threads on the second type of microphone head on a second side of the collar). The collar also includes means for mechanically attaching the collar to the main sleeve such that plug connectors on the top end of the main body connect electrically with the output connectors of the first type of microphone when the collar is attached to the first type of microphone head and the plug connectors on the top end of the main sleeve connect electrically with the output connectors of the second type of microphone head when the collar is attached to the second type of microphone head. In the preferred embodiment of the invention, the collar has keys extending inward and spread circumferentially around the collar. The main body has entry notches for the keys and peripheral key slots for each key on the collar and is configured to attach with the keys whether the reversible collar is being used to connect to the first type of microphone head or the second type of microphone head. It is desirable to provide a compression ring between the collar and the main body when the collar is attached to the main body. The compression ring provides a stable connection and water tightness.

While the collar preferably has threads compatible with the first and second types of microphone heads, it is possible that the collar could be connected to the microphone with alternative means such as a clip-on, a snap-on, or a magnetic connection mechanism.

The plug connectors are preferably spring mounted pins to provide robust contact with the respective annular audio output conductors on the microphone heads. The plug connectors are located in an array at a different radial distance from a center axis of the annular contacts on the first and second type of microphone heads. This enables them to contact a variety of annular audio output contacts. The processing means can determine whether the first type of microphone head or the second type of microphone head is attached by determining whether one or more plugs are shorted together. Analog switches are set depending on the type of microphone detected. In operation the analog microphone signals are amplified, digitized, digitally processed, RF upconverted and amplified for transmission over the RF antenna on the wireless microphone body.

As mentioned above, it may be desired that the microphone body be able to electrically accommodate a third type of microphone head, or even additional types. A third type of microphone head can be accommodated by the invention if the third type is compatible with the mechanical attachment of the first or second type of microphone head, and if the configuration of pin connectors on the microphone body are compatible the third type of microphone head in addition to being compatible with the first and second type of microphone head. In this case, the determination of which type of microphone head is attached can be implemented by the process in FIG. 2D. In turn, analog switches can be set so that the relevant pin connectors, e.g. pins carrying the analog audio signal, are appropriately connected to the circuit (preamp, ADC) leading to the processor (FPGA). A fourth type or more types of microphone heads are possible to accommodate given similar constraints for mechanical attachment and configuration of head electrical output contacts vis-à-vis plug/pin configuration on the microphone body.

Other embodiments and features of the invention may be apparent to those skilled in the art upon review of the drawings and the following description thereof.

BRIEF DESCRIPTION OF THE DRAWINGS

FIG. 2C is a table describing the functions of the pins in FIG. 2B.

DETAILED DESCRIPTION OF THE INVENTION

Figure 1A:
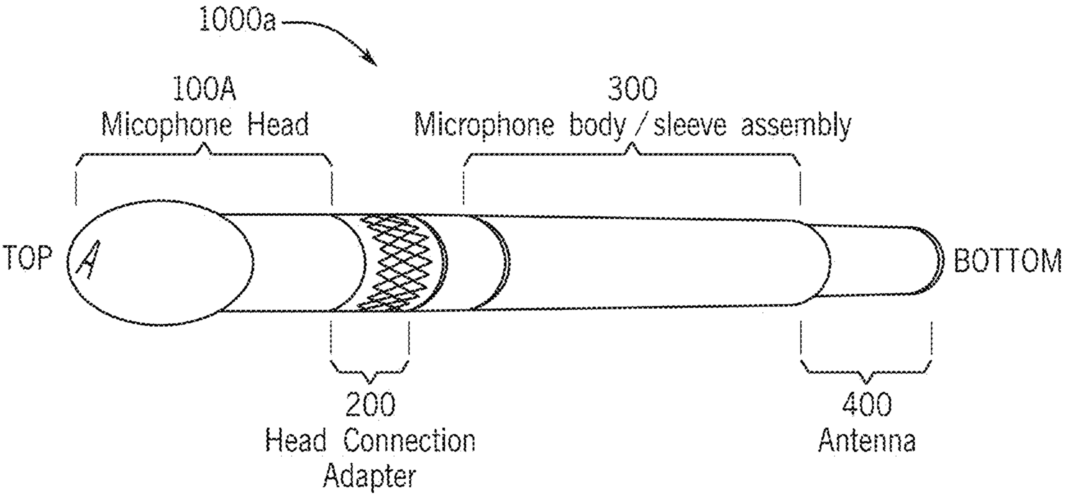
FIGS. 1A and 1B show a handheld wireless microphone body/sleeve assembly connected to a microphone head of "Type A" in FIG. 1A and of "Type B in FIG. 1B. A reversable head connection adapter is used to accommodate the Type A microphone head shown in FIG. 1A or alternatively the Type B microphone head shown in FIG. 1B.
Figure 1B:
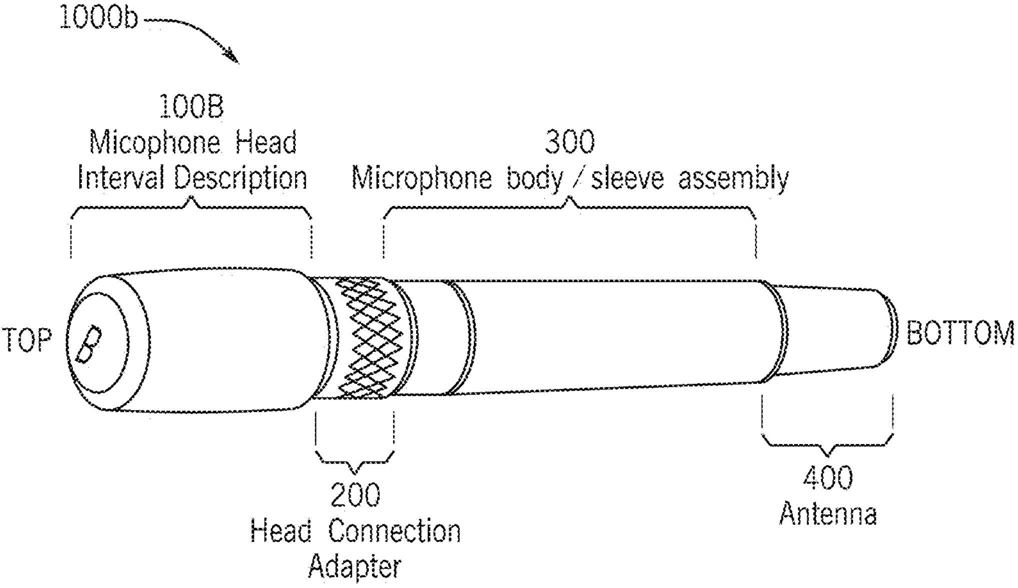

Referring to FIGS. 1A and 1B, reference numbers 1000*a* and 1000*b* refer to complete handheld wireless microphones utilizing a microphone head of Type A and Type B respectively. Both handheld wireless microphones 1000*a* or 1000*b* can generally be thought of as consisting of three (3) connected stages, including: a microphone head 100A or 100B, the head connection adapter 200, and the microphone body/sleeve assembly 300. The microphone head 100A or 100B includes one or more diaphragms and associated electronics to sense acoustic pressure. The internal electronics of the microphone head is normally responsible for many aspects of the microphone frequency response and its directionality profile.

Figure 2A:
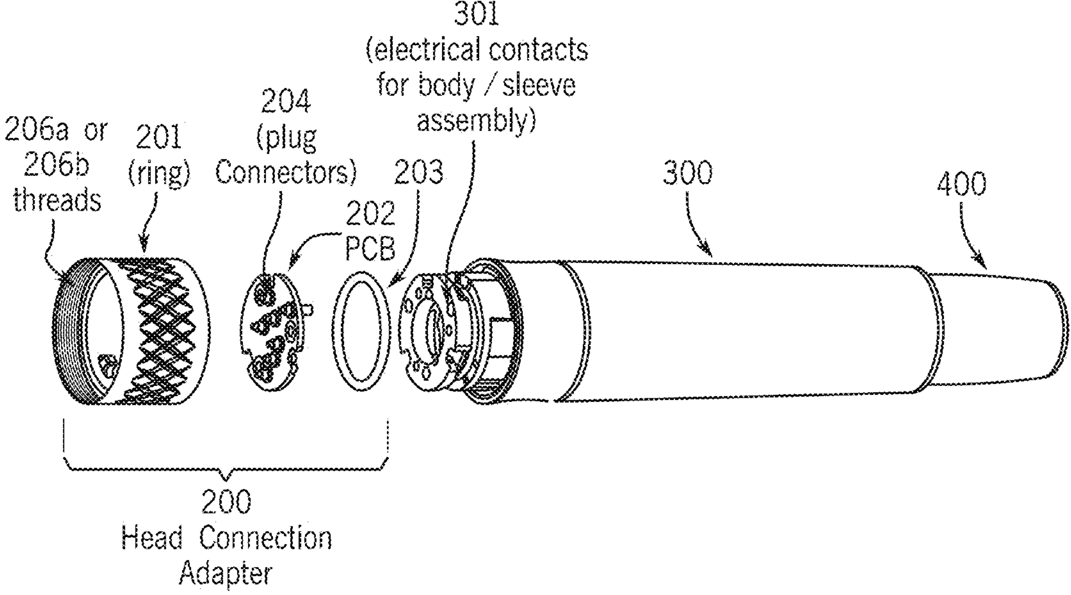
FIG. 2A is an assembly view showing the reversible head connection adapter and components on the handheld wireless microphone body interfacing mechanically and 3 electrically with the reversible head connection adapter and the respective microphone head, according to an exemplary embodiment of this invention.

The main body 300 of the microphone 1000*a*, 1000*b* is surrounded by an outer sleeve which is often removable. The main body 300 of the wireless microphone 1000*a*, 1000*b* generally includes a battery, signal amplification and analog-to-digital converting circuitry, digital signal processing and RF electronics including those for a wireless transmitter. The wireless RF transmitter antenna is usually located towards the bottom of the main body 300, and typically surrounded by a protective chamber 400. Referring to FIG. 2A, the sleeve around the main body 300 is the portion most conveniently held by the hand of a performer while in use. The microphone head connection adapter 200 has a reversible collar ring 201 that facilitates mechanical and electrical connection between the bottom of the respective microphone head 100A or 100B and the top of the main microphone body 300. In the exemplary embodiment of the invention illustrated in FIGS. 1-4, the main body 300 is configured to physically accommodate the reversible head connection adapter 200 and either microphone head 100A or 100B. In other words, it is contemplated that the same wireless microphone body 300 (and antenna 400) be used with the Type A microphone head 100*a* in FIG. 1A and the Type B microphone head 100*b* in FIG. 1B. The same head connection adapter 200 used in FIG. 1A is used in FIG. 1B as well. The type of interconnection for respective microphone head "Type A" or "Type B" is determined by the (up/down) orientation of a collar ring 201 forming a part of the microphone head connection adapter 200 (see FIG. 2A).

The collar ring 201 (FIG. 2A) is configured to mount mechanically and electrically to the main sleeve 300 of the handheld microphone and selectively to either a Type A microphone head or a Type B microphone head. In the exemplary embodiment, the collar ring 201 has a thread size 206*a* compatible with the Type A microphone head 100A on one side and a thread size 206*b* compatible with the Type B microphone head 100B on the other side. The collar ring 201 also has means for mechanically removably attaching the collar ring 201 to the main sleeve 300, such as a keyed rotational slot and compression ring 203.

An array of plug connectors 204, e.g. on a printed circuit board (PCB) 202, are attached to the top end of the main body 300. The array of plug connectors 204 are arranged physically to receive electrical/audio signals from either the Type A or the Type B microphone heads, even though the physical configuration of the audio output conductors on the Type A microphone head are different from the physical configuration of the audio output conductors on the Type B microphone head.

The microphone heads of "Type A" 100A and "Type B" 100B (in FIGS. 1A and 1B, respectively) are assumed to have been made by differing manufacturers and are not required to be inherently electrically or mechanically cross-compatible for the purposes of this invention. However, in the exemplary embodiment of the invention, the PCB assembly 202 is attached to the main microphone body 300, and electronics in the body 300 detect whether the microphone head is a Type A or Type B microphone head and adjust the signal processing in the body 300 to be compatible with either Type A or Type B microphone heads. In this sense, a user or performer may arbitrarily select from between microphone heads 100A (Type A) or 100*b* (Type B) without having to substitute any remaining portions of the handheld wireless microphone apparatus.

Figure 2B:
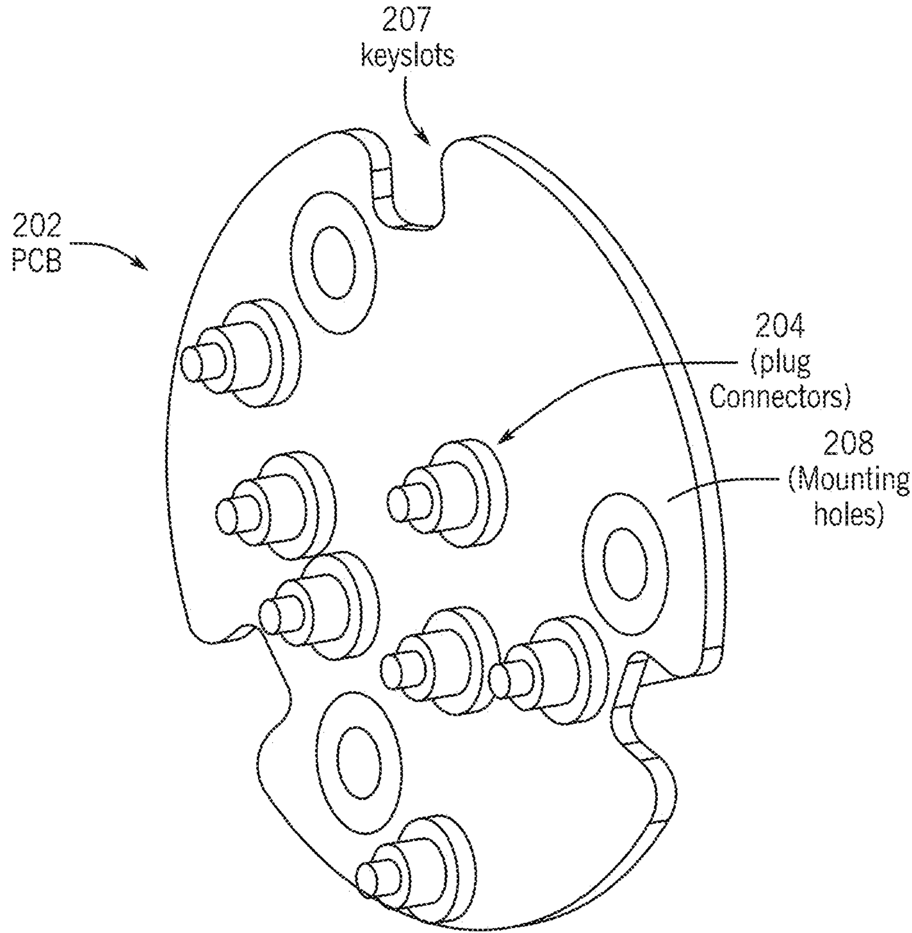
FIG. 2B is a detailed view of the printed circuit board (PCB) shown in FIG. 2A, which includes plug connector pins for making electrical contact with various types of microphone heads.

Referring to FIGS. 2A and 2B, a compression ring 203 is fitted over the top portion of the main microphone body 300. This compression ring 203 provides a spring-like compression between the microphone body/sleeve assembly 300 and the collar ring 201 and can also provide a weather-proof seal. The PCB 202 is shown in greater detail in FIG. 2B. The PCB 202 is mounted to the top of the main sleeve 300 such that a set of plug connectors 204 are mounted facing upward to make contact with the electrical contacts 101A or 101B of the microphone head, 100A or 100B, respectively. In the exemplary embodiment, the spring-loaded plug connectors 204 may be provided by using product number: 0850-0-15-20-83-14-11-0 available from MillMax Manufacturing Corp. As can be seen in FIG. 2B, a series of three mounting holes 208 may be provided for fastening the PCB 202 to the top of the microphone body 300. Finally, a set of three keyslots 207 provide a pathway for the teeth 205 of the connection collar 201 when the teeth 205 are slid into and fastened to the microphone body 300 in preparation of attaching a specific type of microphone head (100A or 100B).

In a preferred embodiment, the compression ring is constructed with rubber or a durable rubber-like material. Alternative embodiments include those where the compression ring 203 is constructed of flexible silicon-based material, or even based on a lightweight scaling spring/compression ring of metal made of brass, stainless steel or other suitable metal. In addition to providing a firm fit (eliminating the risk for rattling), the compression ring 203 may also provide a more weather-proof seal between components to improve resilience when the handheld wireless microphone is used in wet or dusty conditions.

Once all the components of a microphone head connection adapter 200 (shown in FIG. 2A) are assembled, a desired microphone head may be easily attached by threading it into the mated threads 206*a* or 206*b* at the top of the connection collar 201. A salient feature in the exemplary embodiment is the addition of thread types 206*a* or 206*b* (Type A or Type B, respectively) that are compatible with a choice of microphone head 100A, 100B. The choice of which microphone head at this point is determined by the side (and threads) of the connection collar 201 facing upward to receive it. For purposes of this disclosure by way of example, assume that an original microphone head type (206*b* threads facing upward) was initially chosen as "Type B" by a user, 100*b*, FIG. 5B.

Figure 4:
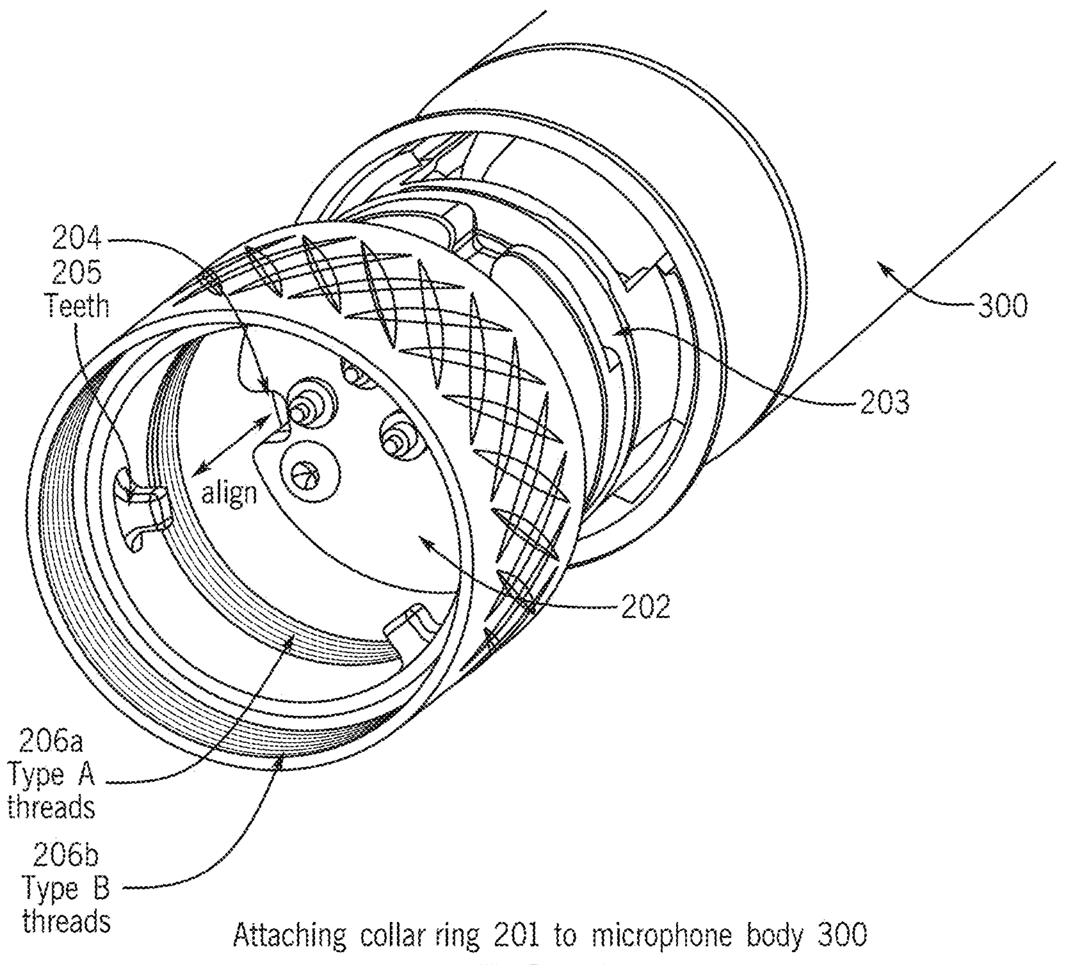

If at a later time, a user (or new user) desires to change to microphone head type, they may do so simply by unscrewing the original (Type B) microphone head 100*b*, to remove it from the connection collar 201. They may then continue by disconnecting the connection collar 201 by rotating it counterclockwise (when looking down) such that the collar keys 205 are aligned with the notches 207 in the PCB 202, pulling it straight off from the PCB 202 and flipping it, as indicated (by the arrows) in FIG. 3 so the other (opposite) set of threads are now facing upward. Referring to FIG. 4, the user may then re-align the connection collar keys 205 with the notches 207 in the PCB 201, press it back down to contact the compression ring 203 and lock it in place by rotating it clockwise (looking down) until it is fully seated. At this point, the user may attach the alternate microphone head 100*a* (Type A) simply by screwing it into the threads provided at the top of the (now flipped) connection collar 201 and the microphone 1000*a* is ready for use.

Figure 5A:
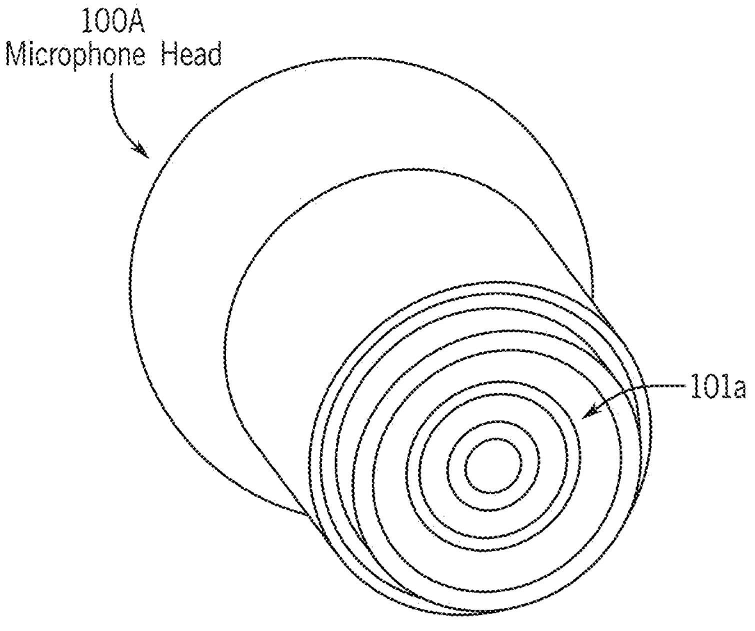
FIGS. 5A and 5B illustrate example configurations for the electrical contacts for different microphone heads, namely, annular conductor configurations for the microphone head types generically referred to as "Type A" and "Type B" throughout this application.
Figure 5B:
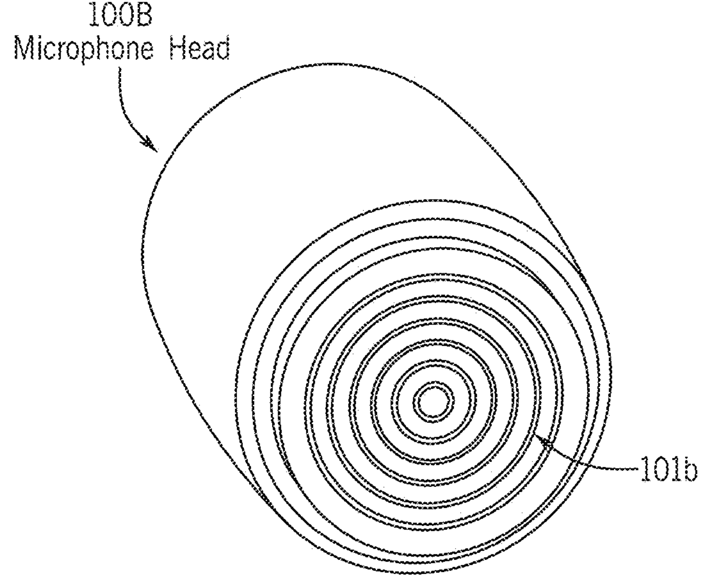

Another exemplary feature for this invention is that differing electrical contact configurations 101*a*, 101*b*, such as those shown in FIGS. 5A and B for the specific cases referred to in this disclosure as "Type A" 100A and "Type B" 100B, may be accommodated. Those who are familiar with the art may wish to compare the electrical contact pattern 101*a* between those shown for a "Type A" 100A, microphone head 100*a* in FIG. 5A and those provided on many popular models of Shure microphone heads. Furthermore, additional insight may be gained by comparing between the electrical contact pattern 101*b* shown for a "Type B" 100B microphone head in FIG. 5B to those provided on several popular models of Sennheiser microphone heads. It should be understood that numerous additional manufacturer types may be accommodated by extending the teachings of this disclosure for the specific configuration (thread type and contact patterns) for each model.

For certain models of microphone heads, one or more plug connectors 204 on the PCB 201 may be electrically shorted together by the electrical contacts 101*a* or 101*b* when connected to a microphone head 100*a* or 100*b*. Software and hardware in the microphone body 300 may use this condition to detect (or narrow down to a subset of) specific models. Furthermore, analog switches in the microphone body 300 may be utilized to reconfigure the connectivity or purpose of various pins to prevent undesired electrical shorts and accommodate the function for a given microphone head type.

Both microphone head types referred to here ("Type A" and "Type B") use a series of concentric annular connectors 501*a* and 501*b* positioned so that as long as the plug connectors 204 on the PCB 202 are positioned at the proper distance from the center of the PCB 202. As a microphone head is threaded into the connection collar 201, plug type electrical contacts 204 are brought into electrical (physical) contact with their corresponding electrical contacts 101*a* or 101*b* on the bottom of the microphone head, 100*a* or 100*b*, respectively. Since the microphone head contacts 101*a* or 101*b* are circular, they can maintain good contact with the spring-loaded plug connectors 204 on the PCB 202 regardless of the angular position that the head 101A or 101B arrives at (relative to the microphone body 300) due to the torque applied by the user when threading on a microphone head 100*a* or 100*b* to the connection collar portion 201 of the head connection collar 200. The pin configuration for the PCB 202 may vary depending on the types of microphone heads that the microphone body and adapter are being configured to interface with.

FIG. 2C describes the function of the pins illustrated on the PCB 202 in FIG. 2B. It is worth noting that for some embodiments, the precise position(s) for the numbered pins may depend on details for the model/construction for the microphone head being matched to those for a desired model of microphone body/sleeve assembly. There are three types of microphone heads, e.g., Type A, Type B, and Type C, in FIG. 2C. Type A and Type B require different threads for mechanical attachment as described above, but Type C needs to use the same threads as either Type A or Type B in order for the collar ring 201 to physically attach the Type C head to the main body 300.

Figure 2D:
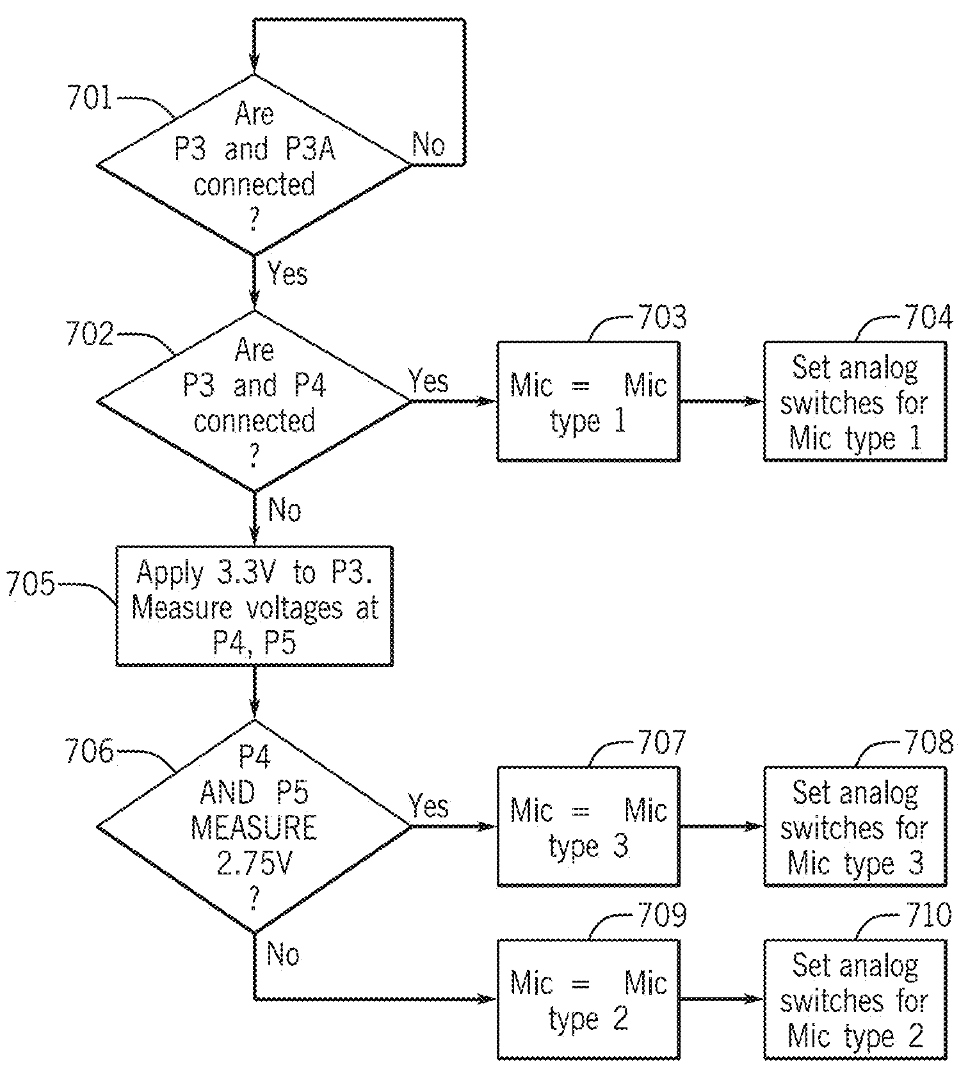
FIG. 2D is flowchart illustrating the steps involved to set analog switches in response to detecting the type of microphone head attached to the wireless microphone body with the head connection adapter shown in FIGS. 1 through 4.
Figure 3:
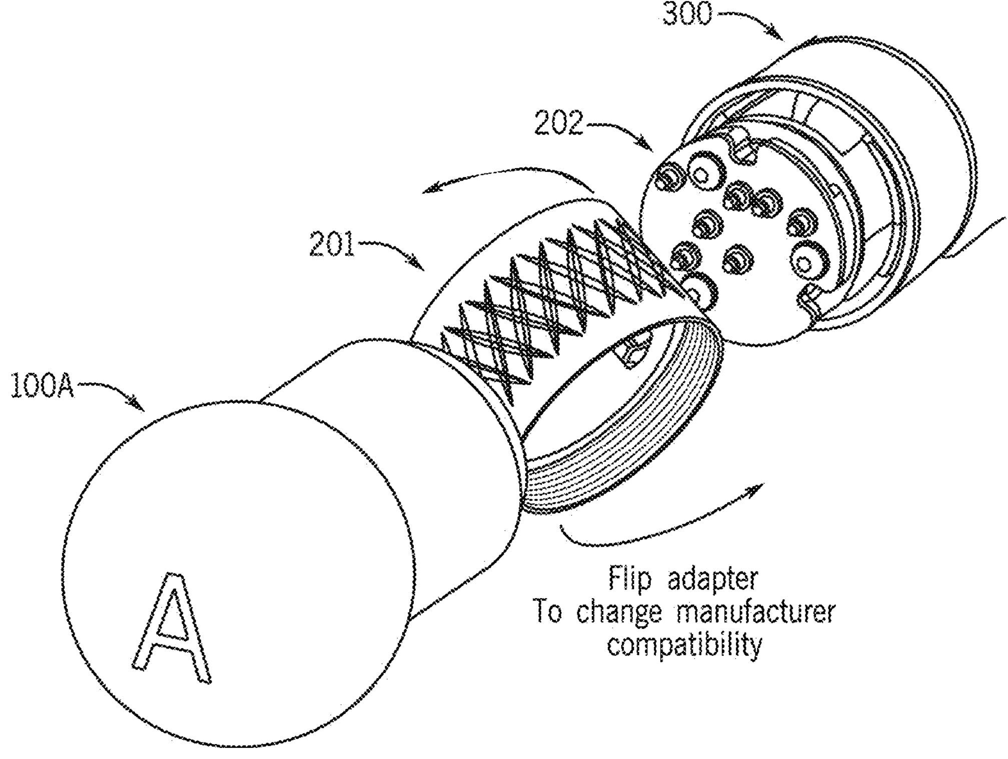
FIGS. 3 and 4 illustrate how the reversible head connection adapter may be removed, flipped and reconnected to accommodate an alternative microphone head according to exemplary embodiment of this invention.

FIG. 2D illustrates the steps involved in setting analog switches in the microphone body in response to detecting the type of microphone head attached. Block 701 indicates that the microcontroller in the microphone body 300 starts out in a state infinitely waiting for P3A to connect to P3. This can be done either by sensing voltage or impedance. If P3A and P3 connect, then the microcontroller checks to see if P3 and P4 are connected, see block 702. This can be done either by sensing voltage or by impedance. If these pins are indeed connected, the head is determined to be Mic Type A, block 703, and analog switches in the circuit in the microphone body are configured to use the signals as shown in table in FIG. 2C for Mic Type A, block 704.

If P3 and P4 are not connected, then 3.3V is applied to the microphone at P3, block 705. The voltage at P4 and P5 are measured while a 10*k* pull-down resistance is applied to both pins, block 706. If 2.75 volts are detected, then this indicates that the head is a Type C head, block 707. The analog switches are then set to use the signals as shown in the chart for head Type C, block 708. Head Type C preferably has an EEPROM connected to P4 and P5. The EEPROM is read, and more information about the mic type, frequency response and other data is read about the mic capsule, and operation commences.

If P3 and P4 do not measure 2.75V, then the head is assumed to be head Type B2, block 709, and the analog switches are set accordingly, see block 710, to use the connections as shown in the table in FIG. 2C.

Figure 6:
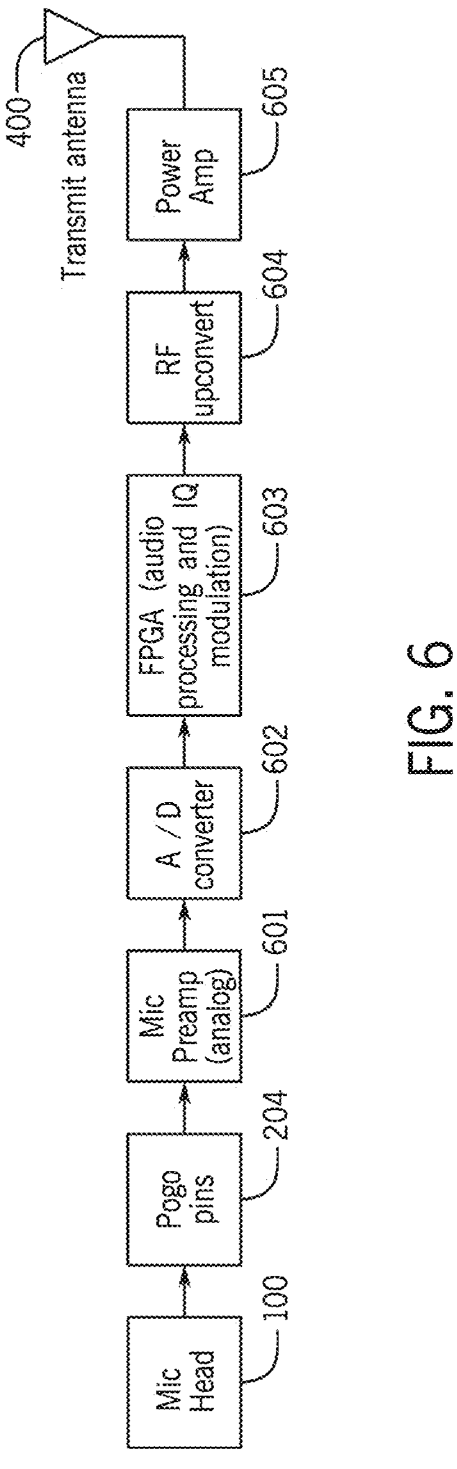
FIG. 6 is a diagram illustrating electrical components of a wireless microphone implementing the exemplary embodiment of the invention.

FIG. 6 illustrates exemplary electrical components of the wireless microphone showing the flow of audio data through the microphone. The microphone head 100 generates an analog audio signal which is transmitted from the head to the assigned connection pins 204 on the body of the microphone 1000, in accordance with FIGS. 2C and 2D as described above. From the pins 204, the analog audio signals are amplified through an analog preamplifier 601, and then digitized by an analog-to-digital converter 602. The digitized audio signals are processed in a microcontroller which in FIG. 6 is a field programable gate array (FPGA) 603. The FPGA 603 implements audio processing and IQ modulation as is known in the art. The processed digital output from the FPGA 604 is RF upconverted 604 and amplified 605, and then transmitted to antenna 400 for radio transmission to a receiver. Although not shown in FIG. 6, the microphone body also includes a battery and power conversion and charging electronics, as is typical in the art.

Although this disclosure has included the use of the phrase "exemplary", the inventors have envisioned alternative designs that are to be considered as within the scope of this disclosure. For example, other embodiments envisioned by this disclosure may include those where a series of cascaded threaded rings allow user to select a desired thread pattern to match a desired microphone head. In this disclosure a two-ended circular microphone head connection collar was featured as an exemplary embodiment. This does not limit the scope of this disclosure to such embodiments. Other embodiments could include those where a Y-shaped (or even cross-shaped or T-shaped) device could provide more than two ends for connections to be facilitated between a microphone head and handheld wireless microphone body. Further embodiments envisioned by this disclosure include those where rather than a threaded connection between a microphone head and adapter ring are present, a clip-on or snap-on or even magnetic connection mechanisms may also be suitable for some embodiments.

The invention claimed is:

1. A handheld wireless microphone apparatus:

a main body;

an RF antenna located in a bottom portion of the main body;

an array of plug connectors attached to a top end of the main body, said array of plug connectors being arranged to receive electrical audio signals from at least a first type of microphone head and from a second type of microphone head, said first type of microphone head having audio output conductors in a first physical configuration, and said second type of microphone head having audio output conductors in a second physical configuration which is different from the first physical configuration of audio output conductors for the first type of microphone head;

processing means located within the main body to receive said electrical audio signals from the array of plug connectors and provide audio transmission signals to the RF antenna for wireless RF transmission;

a collar that includes means for mechanically attaching the collar to the said first type of microphone head, means for mechanically attaching the collar to the said second type of microphone head, and means for mechanically attaching the collar to the top end of the main body such that plug connectors on the top end of the main body connect electrically with the output connectors of the first type of microphone when the collar is attached to the first type of microphone head and the plug connectors on the top end of the main body connect electrically with the output connectors of the second type of microphone head when the collar is attached to the second type of microphone head.

2. The handheld microphone apparatus according to claim 1 wherein the collar is reversible and the means on the collar for mechanically attaching the collar to the said first type of microphone head comprises threads on a first of the collar configured to fit threads on the first type of microphone head, and means on the collar for mechanically attaching the collar to the said second type of microphone head comprises threads on a second side of the collar configured to fit threads on the second type of microphone head, and wherein the threads on second side of the collar are incompatible with the threads on the first type of microphone head and the threads on first side of the collar are incompatible with the threads on the second type of microphone head.

3. The handheld microphone apparatus according to claim 1 wherein the means on the collar for mechanically attaching the collar to the said first type of microphone head comprises a clip-on, a snap-on, or a magnetic connection mechanism, and means on the collar for mechanically attaching the collar to the said second type of microphone head comprises a clip-on, a snap-on, or a magnetic connection mechanism.

4. The handheld microphone apparatus according to claim 1 wherein the means for mechanically attaching the collar to the top end of the main body includes keys extending inward from the inside surface of the collar and spread circumferentially on the inside surface of the collar, and the top end of the main body further comprises an entry notch and a peripheral key slot for each key on the collar.

5. The handheld microphone apparatus according to claim 4 further comprising a compression ring located between the collar and the main body when the collar is attached to the main body.

6. The handheld microphone apparatus according to claim 1 wherein the plug connectors have resilient or spring mounted pins.

7. The handheld microphone apparatus according to claim 6 wherein the audio output conductors on said first and second type of microphone heads comprise a series of annular contacts.

8. The handheld microphone apparatus according to claim 7 wherein the processor determines whether the first type of microphone head or the second type of microphone head is attached by determining whether one or more plugs are shorted together.

9. The handheld microphone apparatus according to claim 7 wherein at least some of the plug connectors in the array are located at different radial distances from a center axis of the annular contacts on the first or second type of microphone heads when the respective head is attached to the collar and the top end of the main body.

10. The handheld microphone apparatus according to claim 1 wherein the processor determines whether the first type of microphone head or the second type of microphone head is attached by taking measurements from defined pin locations of the plug connectors.

11. The handheld microphone apparatus according to claim 10 wherein analog switches are positioned according to the determination of whether the first type of microphone head or the second type of microphone head is attached.

12. The handheld microphone apparatus according to claim 1 wherein the array of plug connectors attached to the top end of the main body are arranged to receive electrical audio signals from a third type of microphone head, said third type of microphone head having audio output conductors in either the first physical configuration or the second configuration; and the collar is able to connect the third type of microphone head to the microphone body using either said means for mechanically attaching the collar to the said first type of microphone head or said means for mechanically attaching the collar to the said second type of microphone head.

13. The handheld microphone apparatus according to claim 10 wherein the processor determines whether the first type of microphone head, the second type of microphone head or the third type of microphone head is attached by taking measurements from defined pin locations of the plug connectors.

14. The handheld microphone apparatus according to claim 13 wherein analog switches are positioned according to the determination of whether the first type of microphone head, the second type of microphone head or the third type of microphone head is attached.

15. The handheld microphone apparatus according to claim 1 wherein the processing means comprises a field programmable gate array and the handheld microphone apparatus further comprising:

a. a preamplifier which receives the analog audio signal and outputs amplified analog audio signal;

b. an analog to digital converter which digitizes the amplified analog signal that is transmitted to the field programmable gate array;

c. an RF upconverting circuit which receives an audio output signal from the field programmable gate array and output an RF audio signal to a power amplifier, which in turn is connected to the antenna.

16. The handheld microphone apparatus according to claim 1 further comprising a battery and power conversion circuitry.

* * * * *